United States Patent [19]

Chen et al.

[11] 4,427,570

[45] Jan. 24, 1984

[54] HIGH-QUANTUM EFFICIENCY, LONG-LIVED LUMINESCING REFRACTORY OXIDES

[75] Inventors: Yok Chen, Oak Ridge; Roberto Gonzalez, Knoxville, both of Tenn.; Geoffrey P. Summers, Stillwater, Okla.

[73] Assignee: The United States of America as represented by the United States Department of Energy, Washington, D.C.

[21] Appl. No.: 447,729

[22] Filed: Dec. 7, 1982

[51] Int. Cl.³ .......................... C09K 11/12; C01F 5/00
[52] U.S. Cl. ............................ 252/301.4 R; 423/636; 423/640
[58] Field of Search .................. 252/301.4 R, 301.17; 423/636, 640

[56] References Cited

U.S. PATENT DOCUMENTS 636,865  11/1899  Straub .............................. 423/636 X
3,829,391  8/1974  Chen et al. ................... 252/301.4 R

OTHER PUBLICATIONS

Point Defects in Solids by Crawford et al., vol. 1, pp. 430-435 pub. by Plenum Press, New York (1972).
Edel et al., J. Phys. C.; Solid State Phys., vol. 12 pp. 5245-5252 (1979).
Gonzalez et al., Phys. Rev. B, vol. 24, No. 12, pp. 6862-6868 (Dec. 15, 1981).
Henderson et al., Phys. Rev., vol. 183, No. 3 pp. 826-831 (Jul. 13, 1969).
Welch et al., J. Phys. C.; Solid St. Phys, vol. 13, pp. 1791-1804 (1980).
Jeffries et al., Physical Rev. B, vol. 25, No. 3, pp. 2077-2080, Feb. 1, 1982.

*Primary Examiner*—F. Edmundson
*Attorney, Agent, or Firm*—Edwin D. Grant; Stephen D. Hamel; Richard G. Besha

[57] ABSTRACT

A crystal having a high-quantum efficiency and a long period of luminescence is formed of an oxide selected from the group consisting of magnesium oxide and calcium oxide and possessing a concentration ratio of H⁻ions to F centers in the range of about 0.05 to about 10.

3 Claims, 3 Drawing Figures

HIGH-QUANTUM EFFICIENCY, LONG-LIVED LUMINESCING REFRACTORY OXIDES

BACKGROUND OF THE INVENTION

This invention, which resulted from contracts with the United States Department of Energy, relates to crystals having desirable luminescence characteristics.

It has long been known that certain crystals luminesce after exposure to particular wavelengths of light, and this phenomenon is used to advantage in various devices such as lasers, photon detectors, image converters, and other quantum-electronic solid-state devices.

The periods of luminescence of most solid-state crystalline materials are short, for example, less than 1 millisecond. The availability of refractory oxide crystals capable of luminescing for long periods can increase the effectiveness of many types of military and scientific devices such as those mentioned above.

A high-quantum efficiency, long-lived luminescing refractory oxide crystal and method for preparation are disclosed herein. The inventors have discovered the origin of the long-lived luminescence in certain crystals and in so doing have discovered the means whereby long-lived luminescence can be controlled and further applications made thereof.

SUMMARY OF THE INVENTION

It is therefore an object of this invention to provide crystals which have longer periods of luminescence after excitation.

Improved luminescent crystals are formed, in accordance with one process disclosed herein, by adding water to an oxide powder selected from the group consisting of magnesium oxide powder and calcium oxide powder, and converting the water-containing oxide powder to a crystal by arc fusion. The crystals are heated to a temperature in the range of about 2,000° K. to 2,400° K. in an atmosphere from the group consisting of magnesium vapor and calcium vapor and at a pressure in the range of about 4 atmospheres to about 7 atmospheres to thereby remove oxygen from the crystal and form F centers therein, and the crystals are cooled to a temperature below 1,000° K. within a period of about two minutes (the process hereafter referred to as thermochemical reduction). In some instances, where the luminescence lifetime is short, the lifetime of a thermochemically reduced M9O crystal can be enhanced by heating the crysal to a temperature in the range of about 1,600° K. to about 1,900° K. in an inert atmosphere such as nitrogen.

DETAILED DESCRIPTION OF THE INVENTION

Figure 1:
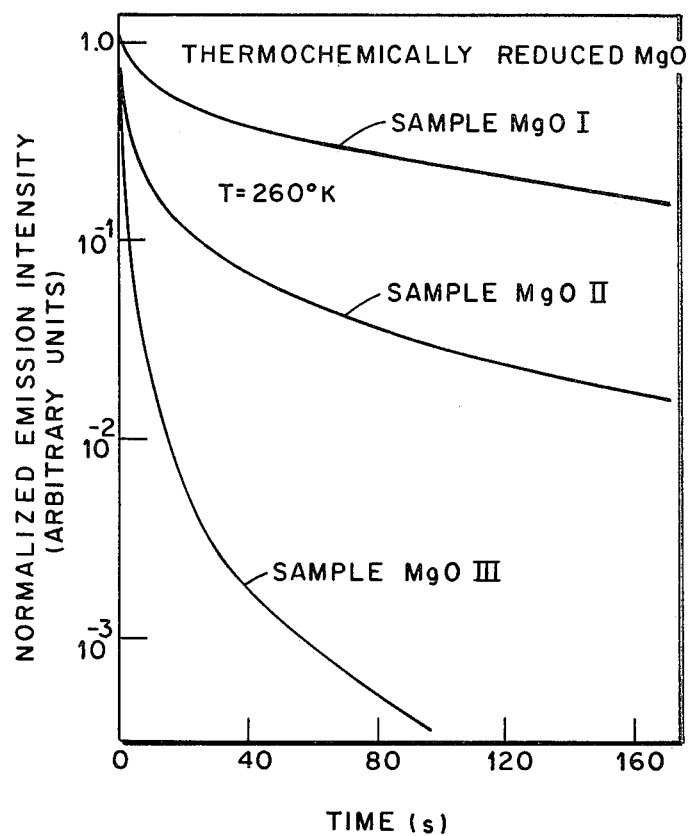
FIG. 1 is a graph showing luminescence decay at 260° K. of the 2.3 eV band in three thermochemically reduced magnesium oxide crystals. This graph illustrates that as the concentration of $H^-$ ions increases, the luminescence at 2.3 eV becomes increasingly long-lived.

An important feature of the herein-disclosed methods of increasing the length of luminescence of a crystal is based on the discovery that long-lived luminescence is attained by procedures for increasing the concentration ratio of $H^-$ ions to F centers in a crystal, an $H^-$ ion being defined as a proton with two electrons and an F center being defined as an oxygen ion vacancy with two electrons. More particularly, for thermochemically reduced magnesium oxide and calcium oxide crystals it has been found that long-lived luminescence can be achieved by manufacturing procedures which provide these crystals with a concentration ratio of $H^-$ ions to F centers in the range of about 0.05 to about 10. The presence of $H^-$ ions alone in a MgO or CaO crystal has been found to be incapable of extending luminescence; the presence of F centers and the proper proportion of $H^-$ ions to F centers is required for long-lived luminescence.

It is believed that the main optical absorption transition of an F center in MgO or CaO crystals takes an electron from the ground state to an excited state and thence to the conduction band. $H^-$ ions serve as metastable traps for electrons optically excited from F centers, thereby forming $H^=$ ions (photons with three electrons). Electrons released from $H^=$ ions are delayed in returning to $F^+$ centers (anion vacancies each with one electron) by being trapped at other $H^-$ ions. When such an electron eventually encounters an $F^+$ center it forms an excited F center. A 2.3 eV green luminescence for MgO or a 2.0 eV orange luminescence for CaO results when the excited F centers emit photons in decaying to the ground state. A relatively high $H^-$ concentration to F center concentration increases the probability for successive captures of electrons by $H^-$ ions and results in longer-lived luminescence.

A magnesium oxide crystal or calcium oxide crystal having the requisite ratio of $H^-$ ions to F centers for prolonged luminescence can be prepared in various ways, including the following. Water can be added to MgO or CaO powder and the water-containing powder fused by the arc fusion process. These crystals are then thermochemically reduced in magnesium or calcium vapor at high temperatures and pressures. A higher concentration of $H^-$ ions will result if the starting powder initially contains water. The F center concentration in the crystal is determined by the temperature and pressure, and the $H^-$ concentration is determined from the water content, resulting in a concentration ratio of $H^-$ ions to F centers within the desired range. Another method of obtaining the requisite $H^-$ ion to F center concentration in a MgO or CaO crystal is to reduce the number of F centers in a crystal which does not have a long luminescence lifetime. In some cases this can be done by heating a MgO crystal, which does not have the required ratio of $H^-$ ions to F centers concentration, under a reducing atmosphere in order to reduce the number of F centers therein and thus increase the concentration ratios of $H^-$ ions to F centers. By decreasing the F center concentration by more than 40%, the lifetime of the luminescence can increase by a factor of about 10.

The following examples illustrate different methods of forming MgO and CaO crystals in accordance with principles of the invention.

EXAMPLE I

Refractory oxide crystals were grown by the well-known arc-fusion method which is described in U.S. Pat. No. 3,829,391, using high purity grade MgO powder obtained from Kanto Chemical Company, Tokyo, Japan. A large hydrogen content in the crystals was obtained by presoaking the MgO powder in water. The crystals, so formed, were then thermochemically reduced at 2,000° K.–2,400° K. under high pressure Mg or Ca vapor (4–7 atm) in a tantalum bomb and rapidly cooled. The result was the formation of F centers and $H^-$ ions. The higher the concentration of hydrogen in the crystal, the higher would be the ratio of the $H^-$ to F center concentration, and therefore the longer would be the lifetime of the phosphorescence.

Three such representative samples were labeled MgO I, MgO II, and MgO III. The concentration of F centers in these specimens was estimated from the absorption coefficient at 4.95 eV, and the concentration of the $H^-$ ions was calculated from the absorption coefficient of a band at 1053 cm$^{-1}$ (0.13 eV). Table I presents a summary of the data for the three specimens.

TABLE I
Characteristics of Thermochemically Colored MgO Specimens

| Sample | $\alpha_F$(cm$^{-1}$)$^a$ | $n_F$(cm$^{-}$)$^b$ | $\alpha_H$(cm$^{-1}$)$^c$ | $n_H$(cm$^{-3}$)$^d$ | luminescence seconds |
|---|---|---|---|---|---|
| MgO I | 330 | (1.6 × 10$^{18}$) | 11 | (3.0 × 10$^{18}$) | 330 |
| MgO II | 820 | (4.1 × 10$^{-18}$) | 0.5 | (1.5 × 10$^{17}$) | 27 |
| MgO III | 110 | (5.5 × 10$^{17}$) | 0.2 | (6 × 10$^{16}$) | 3 |

The letters a, b, c, and d associated with the headings in Table I refer to the following:
$^a$Absorption coefficient at 4.95 eV.
$^b$Calculated using $n_F = 5.0 \times 10^{15}\alpha_F$ where $n_F$ refers to the F center concentration and $\alpha_F$ to the absorption coefficient of the 4.95 eV band.
$^c$Absorption coefficient at 1053 cm$^{-1}$.
$^d$Calculated using the equation $n_H = 2.7 \times 10^{17}\alpha_H$ where $n_H$ refers to the $H^-$concentration and $\alpha_H$ to the absorption coefficient of the absorption peak at 1053 cm$^{-1}$.

Luminescence was excited in the samples at 260° K. with a 60 W deuterium lamp used in conjunction with a 230 nm interference filter. Each sample was illuminated until the emission reached a maximum intensity and then the excitation was removed. The results are presented in FIG. 1 in which the intensity I(t) has been normalized with respect to I(O), the intensities at t=0.

FIG. 1 shows that as the concentration of $H^-$ ion increases, the luminescence at 2.3 eV becomes increasingly long lived. If the period over which the intensity falls to 1/10 of the initial value is taken as a reasonable measure of the phosphorescence lifetime, the characteristic lifetimes (in seconds) for samples I, II, and III are as shown in Table I.

The luminescence itself is not due to $H^-$ ions since a crystal which contained $H^-$ ions but no detectable F centers showed no 2.3 eV emission. Further, contrary to general belief, the degree of phosphorescence does not increase with the concentration of F centers as any process involving interacting pairs of F centers would require. Note that sample MgO II contained about three times the concentration of F centers contained in sample MgO I, but had a characteristic lifetime an order of magnitude smaller.

EXAMPLE II

This example describes the technique for increasing the period of luminescence in a MgO crystal by annealing the crystal to reduce the number of F centers therein.

A magnesium oxide crystal was prepared as described in Example I. The concentration of F centers and $H^-$ ions was estimated from the absorption coefficients at 4.95 eV and 1053 cm$^{-1}$, respectively. The specimen was cooled to 260° K. and illuminated until the emission reached a maximum intensity, excitation was removed, and the period of subsequent luminescence was recorded.

The specimen was then annealed at 1825° K. for a period of 15 minutes in a graphite capsule surrounded by oxygen-free flowing nitrogen gas. Characteristics of the MgO crystal before annealing are identified in the following Table II by the heading "Initial", whereas characteristics of the same crystal after annealing are identified by that heading.

TABLE II

| Sample | $n_F$ | $n_{H^-}$ | Luminescence (seconds) |
|---|---|---|---|
| Initial | 4.1 × 10$^{18}$ | 1.3 × 10$^{17}$ | 20 |
| After annealing | 2.4 × 10$^{18}$ | 1.3 × 10$^{17}$ | 250 |

Table II shows that after annealing the number of F centers had been reduced by 42% while the number of $H^-$ remained unchanged. The resulting increase in the ratio of $H^-$ ions to F center concentration, n($H^-$)/n(F), resulted in an increase in luminescence lifetime by a factor of ten. The inventors have found, as a general rule, that if the ratio of $H^-$ to F centers is increased to greater than 0.05 in this manner, the characteristic lifetime of the luminescence can be expected to be more than 200 seconds.

Figure 2:
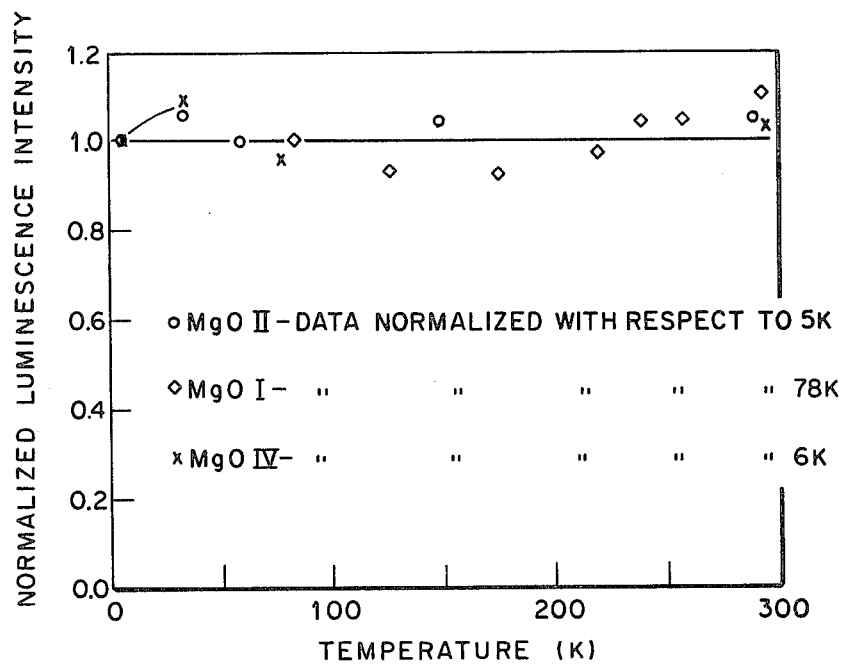
FIG. 2 is a plot showing total luminescence intensity as a function of temperature for three thermochemically reduced magnesium oxide crystals, illustrating that the quantum efficiency at room temperature is near 100%.

FIG. 2 is a graph showing normalized luminescence intensity versus temperature for three MgO specimens with widely different $H^-$ ion and F center concentrations. As explained hereinafter, these data give strong evidence that the quantum efficiencies at room temperature are near 100%. In explanation, anion vacancies in MgO have two-charge states: F$^+$ center (1 electron) and F center (2 electrons). Both F$^+$ and F centers absorb at 5.0 eV. In general, exciting thermochemically reduced MgO specimens with 5.0 eV light produces both 2.3 eV luminescence (green) and 3.2 eV luminescence (blue). At room temperature, the 2.3 eV luminescence dominates, although at lower temperatures in some specimens, the 3.2 eV luminescence can be significant. Data shown in FIG. 2 represents the total intensity of the two luminescence bands in samples in which all the incident light is absorbed. Within the scatter of the data, the constant value of the total luminescence intensity with increasing temperatures indicates a quantum efficiency close to 100% at room temperature for the 2.3 eV luminescence.

EXAMPLE III

Figure 3:
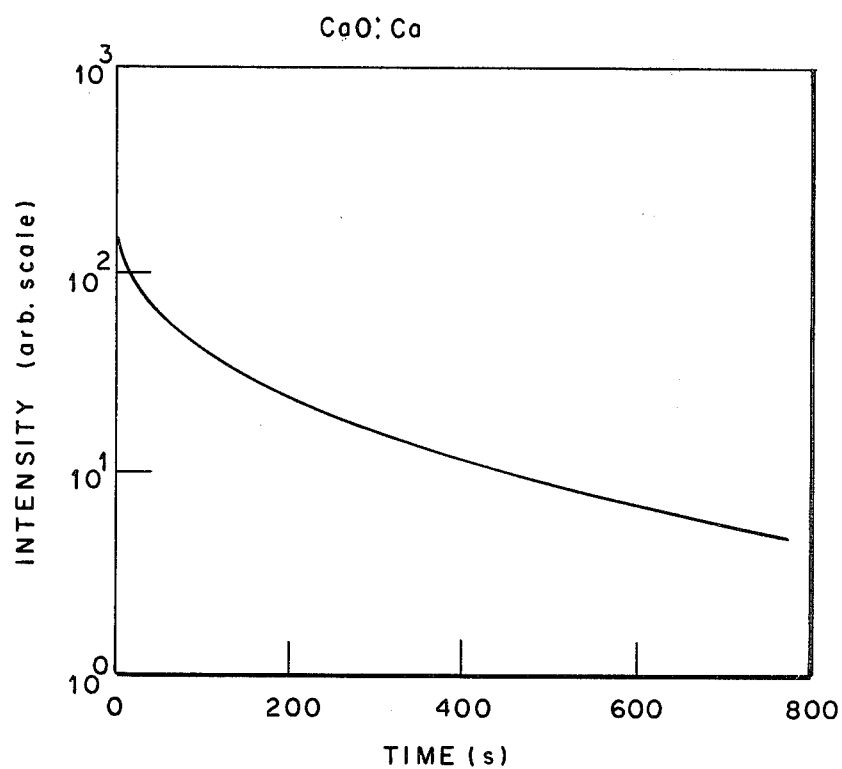
FIG. 3 is a graph showing luminescence decay of the F centers in a thermochemically reduced calcium oxide crystal formed by a method in accordance with the invention.

The starting material for crystal growth of CaO was reagent grade $CaO_3$ powder from Mallinckrodt Chemical Company. During the crystal growth, $CO_2$ gas was evolved due to the reaction $CaCO_3 \rightarrow CaO + CO_2 \uparrow$. Since CaO is hygroscopic, it is virtually impossible to eliminate hydrogen from CaO crystals, especially in subsequent regrowth using leftover materials. Hence, as a general rule, all CaO crystals contain copious quantities of hydrogen. Following thermochemical reduction of these crystals, long-lived luminescence (orange) can be expected. FIG. 3 is a graph showing normalized luminescence intensity versus temperature for CaO crystals thermochemically reduced in accordance with the invention.

On the basis of the above-described experiments, the inventors believe that a similar situation also exists in thermochemically reduced $Al_2O_3$ crystals (sapphire) where long-lived phosphorescence is observed in some samples near room temperature.

What is claimed is:

1. A crystal formed of an oxide selected from the group consisting of magnesium oxide and calcium oxide and possessing a concentration ratio of $H^-$ ions to F centers in the range of about 0.05 to about 10.

2. A method of forming a high-quantum efficiency, long-lived luminescing crystal, comprising the steps of:
    adding water to an oxide powder selected from the group consisting of magnesium oxide powder and calcium oxide powder;
    converting the water-containing oxide powder to a crystal by arc fusion;
    heating said crystal to a temperature in the range of about 2,000° K. to about 2,400° K. in an atmosphere selected from the group consisting of magnesium vapor and calcium vapor and at a pressure in the range of about 4 atmospheres to about 7 atmospheres to thereby remove oxygen from said crystal and form F centers therein; and
    cooling said crystal to a temperature below 1,000° K. within a period of about two minutes.

3. The method of claim 2 including the further step of reheating said crystal to a temperature in the range of about 1,600° K. to about 1,900° K. in an inert atmosphere.

* * * * *